United States Patent [19]

Estrada

[11] Patent Number: 4,972,104
[45] Date of Patent: Nov. 20, 1990

[54] TTL TOTEM POLE ANTI-SIMULTANEOUS CONDUCTION CIRCUIT

[75] Inventor: Julio R. Estrada, South Portland, Me.

[73] Assignee: Fairchild Semiconductor Corporation, Santa Clara, Calif.

[21] Appl. No.: 202,971

[22] Filed: Jun. 3, 1988

[51] Int. Cl.[5] .................... H03K 17/16; H03K 19/003
[52] U.S. Cl. .................................. 307/456; 307/443; 307/475
[58] Field of Search ........................ 307/443, 454–456, 307/458, 475

[56] References Cited

FOREIGN PATENT DOCUMENTS 1318523  5/1973  United Kingdom ................ 307/456

OTHER PUBLICATIONS

Digital Logic Handbook 1973–1974 by Digital Equipment Corporation, pp. 148–149.
IBM Tech. Disc. Bul., "Array Word/Bit Line Driver Circuit", vol. 25, No. 10, Mar., 1983.

*Primary Examiner*—Stanley D. Miller
*Assistant Examiner*—Margaret R. Wambach
*Attorney, Agent, or Firm*—Lee Patch; Daniel H. Kane

[57] ABSTRACT

An anti-simultaneous conduction transistor is incorporated into the standard TTL circuit totem pole to reduce simultaneous conduction of the pullup and pulldown transistor elements of the totem pole. The collector of the active discharge anti-simultaneous conduction transistor element (Q5) is operatively coupled to a base of the pullup transistor element (Q2,Q3) through a diode (D5), the emitter is coupled to low potential, and the base is coupled to the base of the pulldown transistor element (Q4) through ballast resistance (R6,R7). The anti-simultaneous conduction transistor element (Q5) mirrors the conducting state of the pulldown transistor element (Q4) without current hogging substantially diverting or discharging base current from the base of the pullup transistor element (Q2,Q3) whenever the pulldown transistor element (Q4) is conducting. Undesirable current spikes in the sourcing current are avoided by preventing simultaneous conduction in the totem pole.

6 Claims, 2 Drawing Sheets

TTL TOTEM POLE ANTI-SIMULTANEOUS CONDUCTION CIRCUIT

TECHNICAL FIELD

The present invention relates to an improvement in electronic circuits, and particularly TTL circuits incorporating a totem pole. The invention provides an anti-simultaneous conduction circuit which reduces simultaneous conduction of the pullup transistor element and pulldown transistor element. By reducing simultaneous conduction at the totem pole, the anti-simultaneous conduction circuit of the present invention reduces current spikes from the TTL power supply.

BACKGROUND ART

Typical TTL circuits incorporating a totem pole include TTL buffers, TTL output gates or devices, TTL to ECL, and ECL to TTL converters, etc. A prior art TTL output device 10 is illustrated in FIG. 1. A pullup transistor element, Darlington transistor pair Q2 and Q3, sources current from the positive TTL power supply $V_{CC}$ through collector resistor R4 to an output node $V_O$. A pulldown transistor element Q4 sinks current from the output node $V_O$ to ground or low potential. The phase splitter transistor Q1 controls the conducting states of the pullup transistor element Darlington pair Q2, Q3 and the pulldown transistor element Q4 in response to high and low level logic signals at the input node $V_{IN}$ so that the pullup and pulldown transistor elements are generally in opposite conducting states.

The base of phase splitter transistor Q1 is coupled to the input node $V_{IN}$ through the diode network D1,D2,D3 which delivers base drive current to phase splitter transistor Q1 from the TTL power supply $V_{CC}$ through resistor R1 when the input signal at input node $V_{IN}$ is at the logic high level. When a logic low level signal appears at the input node $V_{IN}$ the phase splitter transistor Q1 is deprived of base drive current. The TTL output gate 10 of FIG. 1 is therefore inverting as a logic high level potential signal at input node $V_{IN}$ produces a logic low level potential signal at output node $V_O$ and vice versa.

With a high level potential signal at $V_{IN}$, phase splitter Q1 conducts current from TTL power supply $V_{CC}$ through resistor R2. Current is diverted from the base of the Darlington transistor Q2. Phase splitter transistor Q1 drives the base of the pulldown transistor element Q4. Diode D4 helps discharge the base of Darlington transistor Q3 during the transition from high to low at the output. With a low level potential signal at $V_{IN}$ phase splitter transistor Q1 is not conducting, the pulldown transistor element Q4 is deprived of base drive, and current from TTL power supply $V_{CC}$ through resistor R2 drives the base of the pullup transistor element Q2. Resistor R3 is the discharge path for the pulldown transistor Q4.

The combination of the pullup transistor element Q2,Q3 and the pulldown transistor element Q4, generally in opposite conducting states for controlling the signal potential level at an output node $V_O$, is known as a totem pole. A disadvantage of the totem pole presently incorporated in TTL circuits is that a temporary simultaneous conduction of the totem pole pullup and pulldown transistor elements occurs during transition from low to high level potential at the output $V_O$. When the input signal $V_{IN}$ switches from high to low level potential as illustrated in FIG. 2A, pulldown transistor Q4 starts to turn off. However the Darlington pullup transistor element Q2,Q3 starts conducting while pulldown transistor Q4 is still conducting in the active region. The simultaneous conduction in the totem pole temporarily creates a low impedance path to ground from the power supply before transistor Q4 turns off and before the output signal $V_O$ rises from low to high level potential as illustrated in FIG. 2B. The result is an undesired sudden increase in the supply current or sourcing current $I_S$ from TTL power supply $V_{CC}$ as illustrated in FIG. 2C.

The supply current spiking in conventional TTL circuit totem pole configurations increases power dissipation and heat at the output and causes electromagnetic interference particularly when multiple TTL output devices are switching simultaneously. Another disadvantage of the conventional TTL totem pole circuit configuration, in the case of TTL output gates of the noninverting type, is that the rising ground potential or "ground bounce" caused by supply current spikes for multiple outputs reduces the noise margin for the input signal. Uncontrolled switching of the output circuit may result.

OBJECTS OF THE INVENTION

It is therefore an object of the present invention to provide an improvement in TTL circuit totem pole configurations to reduce simultaneous conduction of the totem pole pullup and pulldown transistor elements thereby minimizing sudden increases or current spikes in the TTL power supply sourcing current.

Another object of the invention is to provide an anti-simultaneous conduction circuit for totem poles to reduce power dissipation and heat accumulation in integrated circuits, reduce electromagnetic interference particularly when multiple outputs are switching, and finally to reduce ground bounce and maintain a safe noise margin when multiple outputs are switching.

A further object of the invention is to provide an anti-simultaneous conduction circuit for TTL circuit totem poles with an active discharge transistor element that mirrors the conducting state of the pulldown transistor element while avoiding current hogging.

DISCLOSURE OF THE INVENTION

In order to accomplish these results the present invention provides an improvement for TTL circuits of the type having an output node, a pullup transistor element for sourcing current from high potential to the output node and a pulldown transistor element for sinking current from the output node to low potential. This combination of a pullup transistor element and pulldown transistor element jointly controlling an output node is generally known as a totem pole. According to the invention the improvement for preventing simultaneous conduction of the pullup and pulldown transistor elements comprises an anti-simultaneous transistor element having a collector operatively coupled to the base of the pullup transistor element and an emitter operatively coupled to low potential for diverting base drive current from the pullup transistor element to low potential when the anti-simultaneous transistor element is conducting.

The anti-simultaneous transistor element is an active discharge transistor element having its base operatively coupled to the base of the pulldown transistor element to follow the conducting state of the pulldown transistor element. The active discharge transistor element therefore helps divert base drive current from the pullup transistor element whenever the pulldown transistor element is conducting. A feature of this arrangement is that the anti-simultaneous transistor element mirrors the conducting state of the pulldown transistor element. Whenever the pulldown transistor element is conducting or tries to turn on, the anti-simultaneous transistor will also turn on actively discharging and turning off the base of the pullup transistor element. A current spike therefore cannot develop as the active discharge transistor maintains the totem pole elements in opposite conducting states.

The collector of the anti-simultaneous transistor element is coupled to the base of the pullup transistor element through a diode oriented to block current flow back to the base of the pullup transistor element. Furthermore the base of the active discharge anti-simultaneous transistor element is coupled to the base of the pulldown transistor element through ballast or buffer resistance selected to substantially avoid current hogging between the active discharge transistor element and the pulldown transistor element. The ballast resistance includes a first resistor coupled to the base of the active discharge transistor element and a second resistor coupled to the base of the pulldown transistor element. The resistors are coupled at a common node. The common node is coupled for example to the emitter of a phase splitter transistor in the case of TTL output devices and buffers.

A feature of the present invention is that it is applicable in any TTL circuit that incorporates a totem pole configuration. Thus the invention is applicable in TTL buffer circuits, TTL output gates and devices, TTL to ECL and ECL to TTL convertors, TTL circuits incorporating a totem pole with or without a phase splitter transistor, etc. The improved totem pole circuit configuration permits controlled switching from low to high potential at the output node at the maximum permissable slew-rate. By avoiding the sudden increases and spikes in supply current the invention reduces power dissipation, heat, electromagnetic interference, and ground bounce. The invention also improves the speed of the low to high transition at the TTL output. Other objects, features and advantages of the invention are apparent in the following specification and accompanying drawings.

DESCRIPTION OF PREFERRED EXAMPLE EMBODIMENTS & BEST MODE OF THE INVENTION

Figure 1:
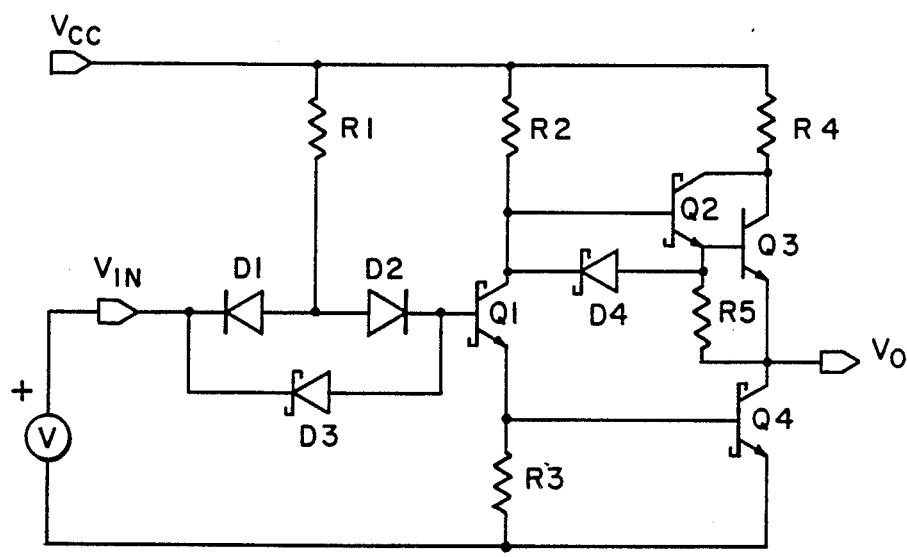
FIG. 1 is a schematic circuit diagram of a prior art TTL inverting output gate.
Figure 2A:
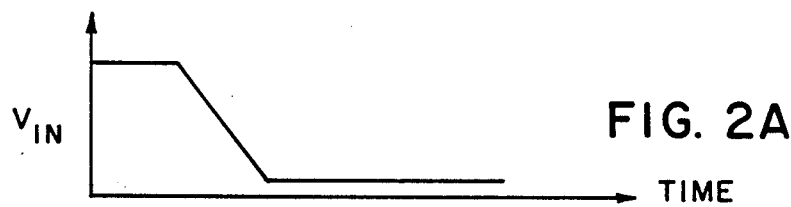
FIGS. 2A, 2B and 2C are diagrammatic graphs of the input signal $V_{IN}$, the output signal $V_O$ and supply current $I_S$ versus time.
Figure 2B:
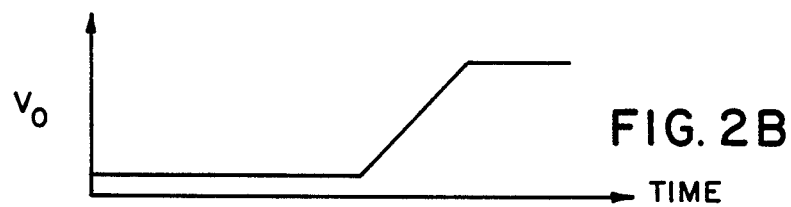
Figure 2C:
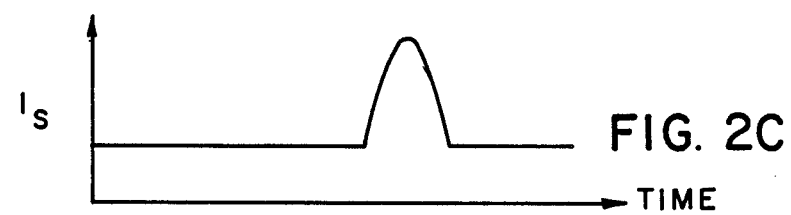
Figure 3:
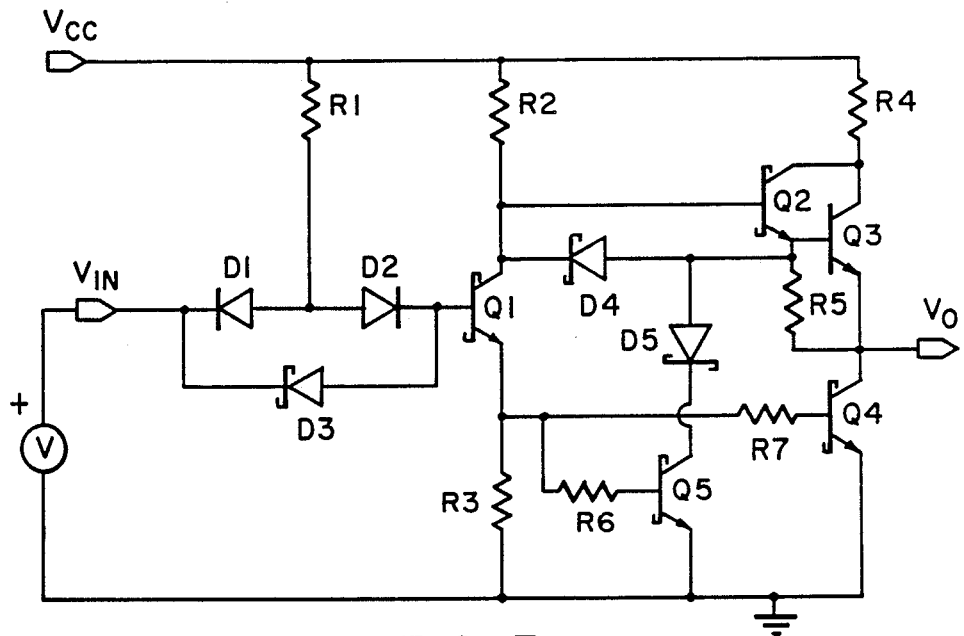
FIG. 3 is a schematic circuit diagram of a generalized TTL output gate incorporating the anti-simultaneous totem pole conduction circuit of the present invention.

An inverting TTL output gate incorporating the anti-simultaneous totem pole conduction circuit of the present invention is illustrated in FIG. 3. Components performing the same function as those illustrated in the TTL output gate of FIG. 1 are identified by the same reference designation. In addition there is added the active discharge transistor or anti-simultaneous transistor Q5 with a collector coupled through diode D5 to the base of the Darlington pulldown transistor pair Q2,Q3. Diode D5 is oriented to block current flow back to the base of the Darlington transistor pair and sets the voltage at the emitter of Darlington transistor Q2 high enough to avoid continuous current drainage through transistor Q5. The emitter of active discharge transistor Q5 is coupled to ground or low potential for diverting and discharging current from the base of the pullup transistor element when the active discharge transistor Q5 is conducting. The base of the active discharge transistor Q5 is coupled through the buffer resistors R6 and R7 to the base of pulldown transistor Q4. As a result the active discharge transistor and anti-simultaneous transistor Q5 mirrors the conducting state of the pulldown transistor Q4. At the same time the values of the resistors R6 and R7 are selected to prevent or reduce current hogging between the transistors Q4 and Q5. Current hogging is the pre-emption of base drive current by one of a pair of transistors coupled in such a mirror configuration as the transistors seek to equalize emitter currents.

When the input changes from high to low phase splitter transistor Q1 turns off. While active discharge transistor Q5 is still in the active conducting region it continues to maintain the base of the pullup transistor Q2 sufficiently low to avoid turn on of the pullup transistors. The anti-simultaneous transistor Q5 does not turn off until pulldown transistor Q4 turns off, only then releasing the base of the pullup transistors. The Darlington transistor pair Q2,Q3 then sources current to the output to pullup the output $V_O$ to the logic high level potential. Whenever the pulldown transistor Q4 tries to turn on for example because of Miller feedback current through its base-collector capacitance, the mirroring active discharge transistor Q5 also turns on, discharging the base of Q2 and turning off the Darlington transistor Q2. Simultaneous conduction of the totem pole is prevented and current spikes in the supply current are therefore avoided. The circuit also provides some improvement during low to high transition in the output also.

Figure 4:
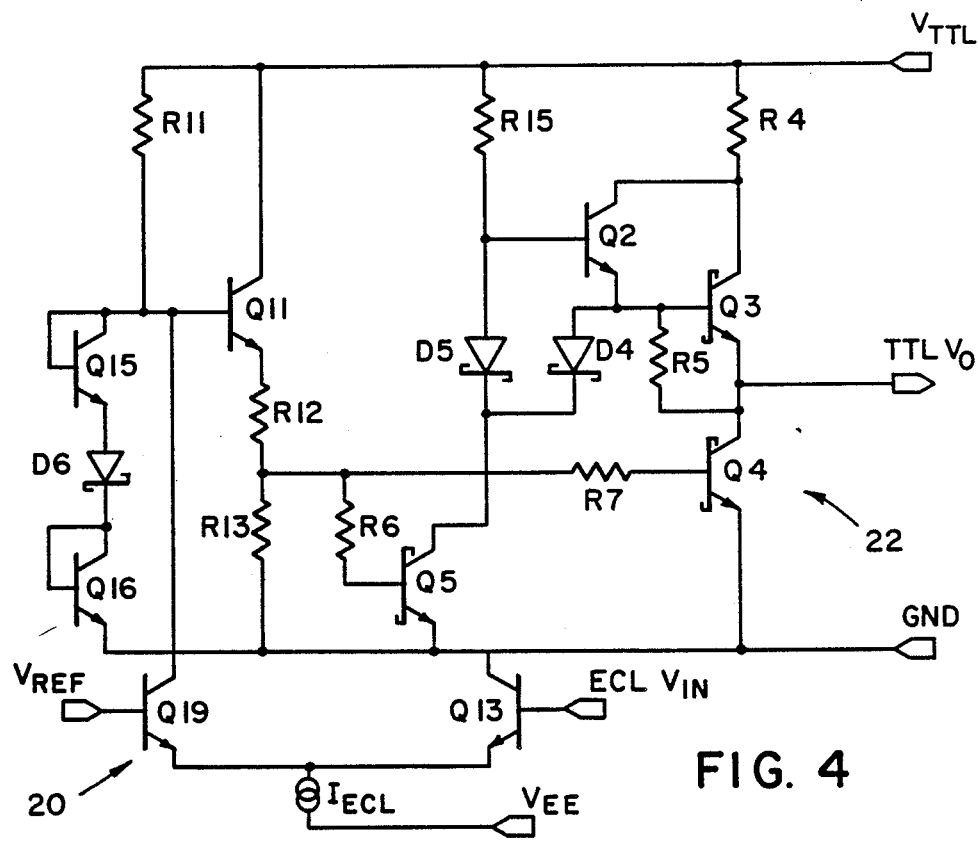
FIG. 4 is a schematic circuit diagram of an ECL to TTL converter or translator incorporating the anti-simultaneous conduction circuit at the TTL totem pole.

The anti-simultaneous conduction circuit consisting of the active discharge transistor Q5, one-way diode D5, and ballast resistors R6 and R7 can be used in any type of TTL circuit incorporating a totem pole with or without a phase splitter for example as shown in the ECL to TTL translator 15 of FIG. 4. The ECL to TTL translator consists of an ECL input gate 20 for receiving ECL voltage level logic input signals ECL $V_{IN}$ at the input transistor Q13 compatible with ECL circuits and a TTL output gate 22 for delivering corresponding TTL voltage level logic output signals at the output $V_O$ compatible with TTL circuits. The ECL input gate 20 includes a differential ECL pair of transistors, input transistor Q13 and reference transistor Q19 with a common emitter coupling connected to the ECL current source $I_{ECL}$.

The input and reference transistors Q13 and Q19 provide alternative transistor collector paths through load resistors R11 and R15 according to the ECL logic level voltage signal at the ECL input ECL $V_{IN}$. Transistor Q19 controls the base of transistor Q11 which provides base drive to TTL output pulldown transistor Q4. Diode connected transistor Q15, diode D6, and diode connected transistor Q16 provide a voltage clamp, clamping the base of transistor Q11 when reference transistor Q19 is nonconducting and resistor R11 is pulling up the base of Q11. The voltage at the base of Q11 is clamped to a level so that the current through Q11 is limited. The ECL high and low level logic potential levels ECL $V_{IN}$ are established on either side of the reference potential $V_{REF}$ applied at the base of reference transistor Q19 so that either one or the other of the reference transistor Q19 or input transistor Q13 is conducting. The current source $I_{ECL}$ is connected to a low level voltage source $V_{EE}$ for example $-5$ volts $+/-0.5$ volts so that the ECL logic voltage levels are in the negative voltage potential range.

The TTL output 22 translates the negative potential logic level signals at the ECL input gate to corresponding high and low level voltage signals in the positive TTL voltage range compatible with TTL circuits. The elements of the TTL output gate 22 performing functions comparable to the totem pole components of the TTL output gate illustrated in FIG. 3 are identified by the same reference designations. In particular the TTL output gate includes the totem pole consisting of the Darlington transistor pair pullup element Q2,Q3 and the pulldown transistor element Q4. Resistor R15 provides the base drive to the Darlington pullup element Q2,Q3. Diode D4 helps discharge the base of Darlington transistor Q3 during the low to high transition of the TTL output TTL $V_O$. Diode D5 serves dual purposes in the ECL to TTL translator and in the anti-simultaneous conduction circuit. To the TTL output gate 22 is added the anti-simultaneous conduction circuit of the present invention comprising the anti-simultaneous active discharge transistor element Q5, one-way diode D5 already present in the ECL to TTL translator, and buffer resistors R6 and R7 performing the functions heretofore described with the same features and advantages. The anti-simultaneous conduction circuit reduces simultaneous conduction in the totem pole thereby substantially avoiding undesirable current spikes in the TTL supply current.

While the invention has been described with reference to particular TTL circuits it is applicable to any TTL circuit incorporating a totem pole. For example the invention is applicable in other ECL to TTL translators such as described in U.S. Pat. No. 4,677,320 and TTL to ECL translators such as described in U.S. Pat. No. 4,654,549. Similarly the invention is applicable in all types of TTL buffer circuits and output circuits such as multiple phase splitter TTL output circuits and TTL tristate output circuits such as described in U.S. Pat. Nos. 4,661,727, 4,287,433 and 4,255,670; to TTL output circuits with so called "AC miller killers" such as described in U.S. Pat. Nos. 4,321,490 and 4,330,723; to TTL output devices and TTL tristate devices incorporating so called "DC miller killers" such as described in U.S. Pat. Nos. 4,311,927 and 4,581,550; to TTL circuits incorporating a totem pole with or without a phase splitter; and to any of a variety of other TTL circuits. The anti-simultaneous conduction circuit of the present invention is also applicable to the complementary metal oxide semiconductor (CMOS) family of logic circuits incorporating a CMOS totem pole with active pullup and pulldown transistor elements. The anti-simultaneous transistor element and related components of the present invention in CMOS are incorporated in the logic circuit as described. The invention is therefore intended to cover all variations, modifications, and equivalents within the scope of the following claims.

I claim:

1. In a circuit having an output node, a pullup element for sourcing current from high potential to the output node, and a pulldown element for sinking current from the output node to low potential, the improvement for reducing simultaneous conduction of the pullup and pulldown elements comprising;
   an active anti-simultaneous element having a collector node operatively coupled to a base node of the pullup element and an emitter node operatively coupled to low potential for diverting base drive current from the pullup element to low potential when the anti-simultaneous element is conducting, said anti-simultaneous element having a base node operatively coupled to the base node of the pulldown element to follow the conducting state of the pulldown element and substantially divert base drive current from the pullup element whenever the pulldown element is conducting;
   said base node of the anti-simultaneous element being operatively coupled to the base node of the pulldown element through resistor means selected to substantially reduce current hogging between the anti-simultaneous element and the pulldown element, said resistor means comprising a first resistor element coupled to the base node of the pulldown element, and a second resistor element coupled to the base of the anti-simultaneous element, said first and second resistor elements being coupled at a common node;
   said collector node of the anti-simultaneous element being operatively coupled to the base node of the pullup element through a diode.

2. The circuit of claim 1 further comprising a phase splitter element for controlling the conducting state of the pulldown element, the phase splitter element having an emitter node coupled to the common node of said first and second resistor elements.

3. In a TTL circuit totem pole having a pullup transistor element for sourcing current from high potential to an output node and a pulldown transistor element for sinking current from the output node to low potential, the improvement for reducing simultaneous conduction of the pullup and pulldown transistor elements comprising;
   an active discharge transistor element having a collector node operatively coupled to the base of the pullup transistor element, an emitter node operatively coupled to low potential, and a base node operatively coupled to the base node of the pulldown transistor element so that the conducting state of the active discharge transistor element follows the conducting state of the pulldown transistor element for substantially diverting base drive current from the base of the pullup transistor element whenever the pulldown transistor element is conducting;
   said base node of the active discharge transistor element being operatively coupled to the base node of the pulldown transistor element through resistor means selected to substantially avoid current hogging between the active discharge transistor element and the pulldown transistor element;
   said resistor means comprising a first resistor element operatively coupled to the base node of the active discharge transistor element, and a second resistor element operatively coupled to the base node of the pulldown transistor element;

the collector node of the active discharge transistor element being operatively coupled to the base node of the pullup transistor element through a diode oriented to block current flow back to the base of the pullup transistor element.

4. The TTL circuit totem pole of claim 2 comprising a phase splitter transistor element operatively coupled to the totem pole for controlling the conducting state of the pulldown transistor element, the emitter node of said phase splitter transistor being coupled respectively to the base nodes of the active discharge transistor element and the pulldown transistor element through the first and second resistor elements.

5. An ECL to TTL translator circuit including a TTL output circuit totem pole having a pullup transistor element for sourcing current from high potential to an output node and a pulldown transistor element for sinking current from the output node to low potential, the improvement comprising:

an anti-simultaneous conduction transistor element having a collector node operatively coupled to a base node of the pullup transistor element and an emitter node coupled to low potential, the base node of said anti-simultaneous conduction transistor element being operatively coupled to the base node of the pulldown transistor element to follow the conducting state of the pulldown transistor element and substantially divert base drive current from the base of the pullup transistor element whenever the pulldown transistor element is conducting;

phase splitter means operatively coupled for controlling the conducting state of the pulldown transistor element without direct coupling to the pullup transistor element; and an ECL circuit coupled to control the conducting state of said phase splitter means.

6. An ECL to TTL translator circuit with a TTL output totem pole having a pullup transistor element for sourcing current from high potential to an output node and a pulldown transistor element for sinking current from the output node to low potential, the improvement comprising:

a phase splitter transistor element operatively coupled to the pulldown transistor element without direct coupling to the pullup transistor element, for controlling the conducting state of the pulldown transistor element;

an ECL circuit coupled to control the conducting state of the phase splitter transistor element;

an anti-simultaneous conduction transistor element operatively coupled to the pullup transistor element for controlling the conducting state of the pullup transistor element, said anti-simultaneous conduction transistor element having a collector node operatively coupled to a base node of the pullup transistor element and an emitter node coupled to low potential, the base node of said anti-simultaneous conduction transistor element being operatively coupled to the base node of the pulldown transistor element to follow the conducting state of the pulldown transistor element and substantially divert base drive current from the base node of the pullup transistor element whenever the pulldown transistor element is conducting;

said anti-simultaneous conduction transistor element collector node being coupled to a base node of the pullup transistor element through a diode;

said phase splitter transistor element and anti-simultaneous conduction transistor element being coupled to control the conducting states of the pullup and pulldown transistor elements in opposite phases;

and first and second ballast resistor elements coupled respectively to the base nodes of the pulldown transistor element and anti-simultaneous conduction transistor element to reduce current hogging.

* * * * *